Figure 1:
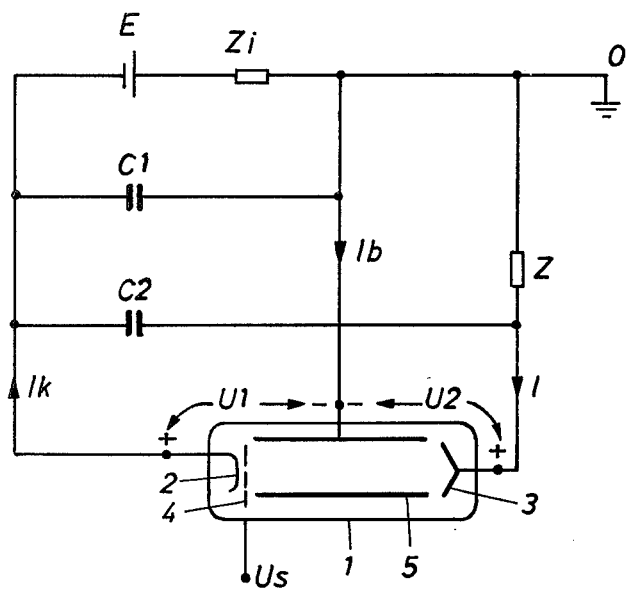

United States Patent
Carlsson

[11] 4,101,804
[45] Jul. 18, 1978

[54] TRAVELING WAVE TUBE WITH DEPRESSED COLLECTOR POWER SUPPLY

[75] Inventor: Leif Ronny Carlsson, Fjäras, Sweden

[73] Assignee: Telefonaktiebolaget L M Ericsson, Stockholm, Sweden

[21] Appl. No.: 799,248

[22] Filed: May 23, 1977

[30] Foreign Application Priority Data

Jun. 23, 1976 [SE] Sweden .............................. 7607244

[51] Int. Cl.² ............................................. H01J 23/34
[52] U.S. Cl. .................................... 315/3.5; 315/5.38; 315/235; 315/241 R
[58] Field of Search ................... 330/43; 315/3.5, 235, 315/241 R, 5.38

[56] References Cited

U.S. PATENT DOCUMENTS

| 3,172,004 | 3/1965 | Von Gutfeld et al. | 315/3.5 X |
| 3,644,778 | 2/1972 | Mihran et al. | 315/3.5 X |

*Primary Examiner*—Alfred E. Smith
*Assistant Examiner*—Charles F. Roberts
*Attorney, Agent, or Firm*—Hane, Roberts, Spiecens & Cohen

[57] ABSTRACT

The power supply for a traveling wave tube which has a cathode, a grid, a collector and a wave structure is connected between the cathode and a reference potential while first and second capacitors connected to the power supply and interconnected by a current blocking impedance deliver current respectively to the wave structure and the collector when the tube is conducting.

3 Claims, 3 Drawing Figures

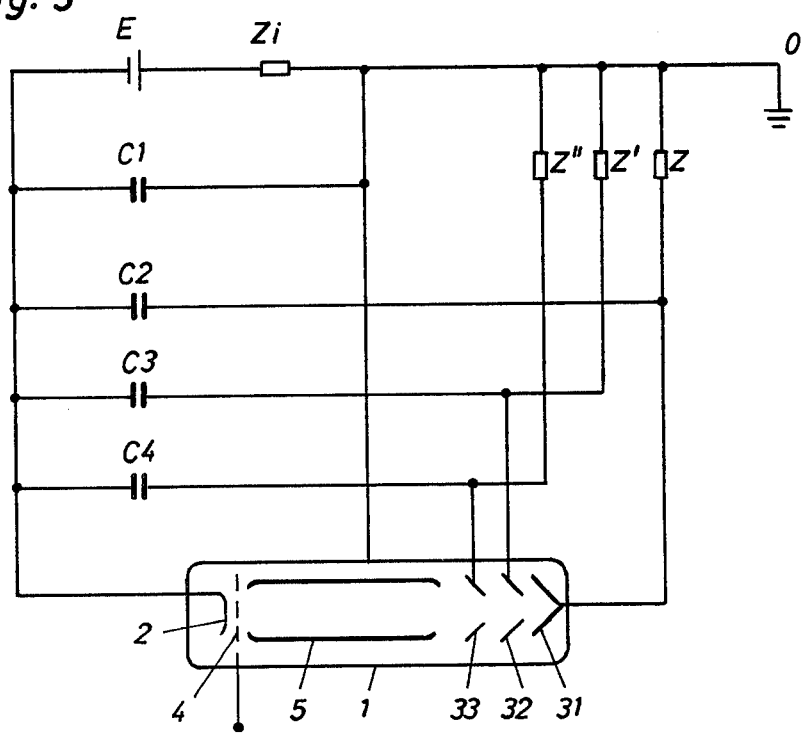

TRAVELING WAVE TUBE WITH DEPRESSED COLLECTOR POWER SUPPLY

The present invention relates to a power supply for a pulsed traveling wave tube with depressed collector.

More specific, the invention relates to a power supply for a pulsed traveling wave tube which is included in airborne radar equipment where high demands are put on limitation of weight and volume.

In a microwave amplifier of traveling wave type, an electron beam is emitted from the cathode of the tube towards its collector and the electron beam is brought to interact with an electromagnetic wave which travels along a wave structure (helix or connected cavities) arranged around the electron beam in the tube. The result will be that the electrons deliver energy to the wave traveling in the wave structure, an amplification of this being obtained while the electrons lose speed on their way towards the collector.

The efficiency of the traveling wave tube is among other things dependent on the electron speed at the collector and, in order to obtain optimal efficiency, it is desirable that the electron speed at the collector is as low as possible, so that no unnecessary power loss is developed. Efforts have been made to reduce the potential of the collector relatively the cathode (so called depressed collector) and it is found that the potential of the collector can be about 50 percent of the potential in the cathode relatively the wave structure without influencing the focusing of the electron beam and thus the amplification of the wave. Known power supplies for a traveling wave tube with depressed collector are in common constructed with two separate voltage sources where one voltage source determines the collector potential of the tube relatively the cathode and the other source determines the potential of the wave structure relatively the cathode. At pulsed traveling wave tubes, i.e. the electron beam is controlled by means of an external pulse source, furthermore, capacitors are connected across each voltage source for storing energy. The advantage with two different voltage sources is that the collector and the wave structure current is distributed for which reason the cathode voltage drop during the pulse can be kept within a permitted range. The collector current which is considerably larger than the current through the wave structure, thus, is delivered from the capacitor which is connected across the cathode-collector path of the tube, the pulse voltage drop across this capacitor being relatively uncritical for the tube. By distributing the current, the capacitance of the capacitor which delivers the cathode current can be made small. The stored energy, therefore, becomes small which reduces the need for so called "crow-bar", i.e. a protection arrangement for short-circuiting between cathode and wave structure of the tube which otherwise would be necessary owing to too high stored energy in the capacitor which delivers the cathode current. Such protection arrangement has relatively large volume, unreliable function and is sensible for external disturbances. The mentioned construction of power supply is, however, volume consuming (two power sources) and the capacitor connected through the cathode-collector path of the tube has to be made relatively large.

Power supplies are also known which include only one voltage source and in which a resistor is connected between the source and the collector in order to obtain depression. Such a type of connection does not, however, eliminate the need for said "crow-bar", since the total current, i.e. the collector current and the current to the wave structures are delivered from only one capacitor connected in parallel with the power supply source.

One object of the present invention is to provide a power supply for a pulsed traveling wave tube with depressed collector which requires comparatively small volume and which gives good efficiency of the tube.

The invention, the characteristics of which appear from the appended claims, will be described more in detail with reference to the accompanying drawings.

FIG. 1 shows a circuit diagram of a pulsed traveling wave tube with depressed collector connected to a power supply according to the invention.

Figure 2:
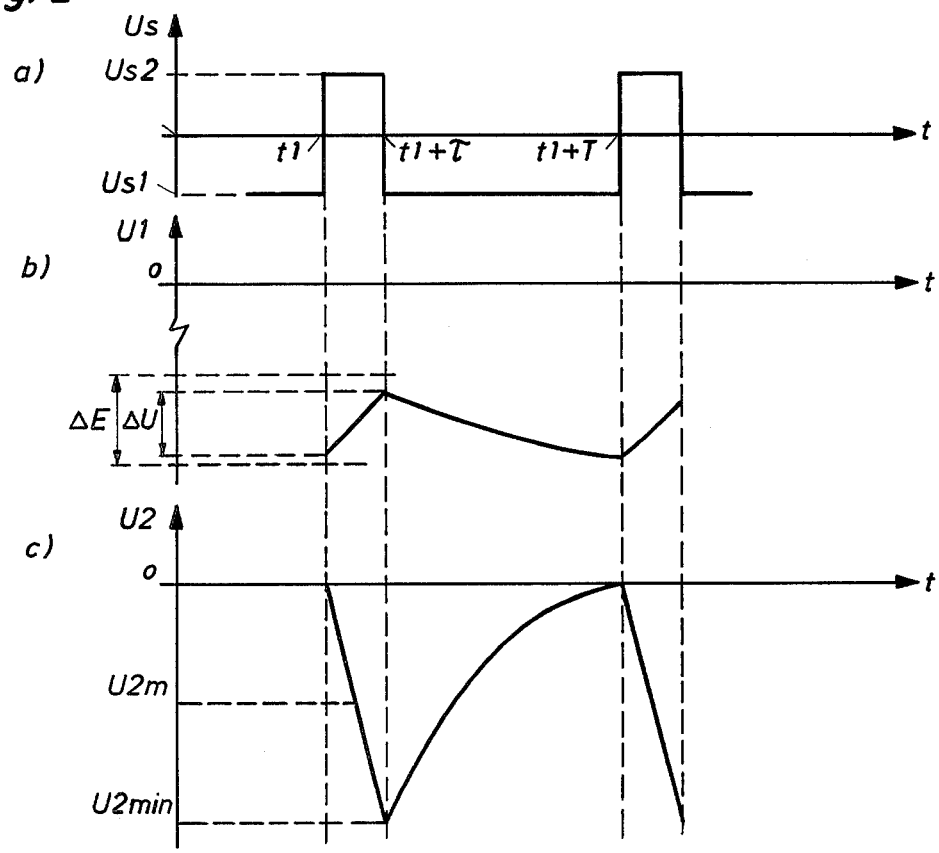

FIG. 2 $a$–$c$ shows a time diagram of certain voltages for illustrating the operation of the power supply according to FIG. 1.

FIG. 3 shows circuit diagram of a power supply according to the invention applied to a traveling wave tube with several depressed collectors.

In the circuit diagram according to FIG. 1, a traveling wave tube generally has the reference 1. The tube comprises a cathode 2, a collector 3 and a grid 4 to which a pulse source (not shown) is connected for control of the electron beam between the cathode 2 and the collector 3. A wave structure in the form of a helix or coupled cavities is schematically indicated with the reference 5. A voltage source E with associated internal impedance Zi is connected to the cathode 2 of the tube and to a reference potential 0. The voltage source E is of the magnitude 30kV. A first capacitor C1 is connected across the voltage source E, Zi, to the wave structure and to the reference potential 0. A second capacitor C2 is connected between the cathode 2 and the collector 3 of the tube. An impedance Z is connected between the capacitors C1 and C2 and to the reference potential 0. The voltage across the capacitor C1 determines the acceleration voltage for the electrons in the electron beam from the cathode of the tube towards the collector and the voltage through the impedance Z determines the potential of the collector (relatively the reference potential 0) i.e. the depression degree. The current Ib and Icoll to the wave structure 5 and to the collector 3, respectively is then delivered from the capacitors C1 and C2, respectively. The grid 4 has an external connection terminal Us to which control pulses to the tube are supplied.

When the tube is pulsed by means of control pulses through the terminal Us, the tube is alternatingly conducting and blocked. In FIG. 2$a$, a control pulse is shown which at the time t1 changes the value from negative potential Us1 to positive potential Us2 relatively the cathode potential. Then the tube becomes conducting and a stream of electrons will pass from the cathode to the collector accelerated by the (negative) voltage across the capacitor C1. FIG. 2$b$ shows the potential U1 of the cathode i.e. the voltage across the capacitor C1 which during the time interval $\tau$ increases towards the value zero, i.e. a discharge of the capacitor C1 occurs. At the time $t1 + \tau$ the control pulse Us changes polarity and the tube becomes blocked, the discharging of the capacitor C1 being ceased and, instead, is being charged from the voltage source E, Zi. The pulse voltage drop U1 is determined by the relation $\Delta U = i\,\tau/Ci$, where $i$ is the instantaneous operating current through the capacitor C1. As this capacitor is connected between the wave structure 5 and the cathode 2, $i = Ib$ which is of the magnitude some tenth parts of the cathode current $Ik$ ($Ib \approx 0{,}2Ik$). This causes in turn that the pulse voltage drop U, even when the capacitance of the capacitor C1 is small, can be kept low and smaller than a certain specified value $\Delta$ E in FIG. 1b, whereby the use of some protection arrangement in the form of "crow-bar" is avoided. During the time interval $t1 + \tau$ to $i1 + T$, the capacitor C1 is charged from the voltage source E, Zi.

In FIG. 2c, the potential U2 of the collector, i.e. the voltage across the impedance Z is shown. When the tube is conducting during the time interval $t1$ to $t1 + \tau$, the capacitor C2 delivers collector current Icoll to the tube. Thus, the capacitor C2 delivers all the collector current to the tube when it is conducting and all the pulse voltage drop through the tube appears across the capacitor C2 which can be made small, c.f. the relation $\Delta U = i\tau /C$. The impedance Z has the function to prevent discharge of the capacitor C1 through the capacitor C2 which otherwise would imply that a higher current than that required for the wave structure would be delivered from the capacitor C1. From the diagram according to FIG. 2c it appears that during the time when the tube is conducting a desired depression of the collector is obtained from a value of the collector voltage close to zero to a minimum value U2min, determined by the focusing requirements of the tube. The average value $U2m = U2min/2$ determines the average depression degree during the time interval when the tube is conducting which can be estimated to give an efficiency of the tube of about 25 percent. The value of the impedance Z and of the capacitance of the capacitor C2 is suitably chosen so that $U2min = E/2 = 15kV$, if $E = 30kV$.

By the proposed design of the power supply according to FIG. 1 is achieved that the current Ib to the wave structure and the collector current Icoll can be delivered from different capacitors which are charged from one and the same voltage source. No protection arrangement in the form of "crow-bar" is required and thus an important gain in volume may be achieved in comparison to a power supply with different voltage sources which is of importance especially at airborne equipment. As an example of dimensioning the components included in the power supply, the following values can be mentioned: $C1 = 25nF$, $C2 = 5nF$, $Z = R = 70 k \Omega$ (pure resistance) for $E = 30kV$, $\tau/T = 1\%$, $Ik = 8A$.

The proposed power supply circuit can also be used in traveling wave tubes with several depressed collectors see FIG. 3. The traveling wave tube here includes a number of collectors 31, 32, 33. The capacitor C1 delivers as in the embodiment according to FIG. 1 the current Ib to the wave structure 5 and the capacitors C2, C3, C4 deliver the collector current to the collectors 31, 32, 33. The impedances Z', Z''and Z serve the same purpose as the impedance Z according to FIG. 1, viz to block the current from the capacitor C1 so that this mainly delivers current only to the wave structure.

We claim:

1. Power supply for a traveling wave tube with depressed collector which tube comprises a cathode, a grid, a collector and a wave structure arranged in the longitudinal direction of the tube, characterized in a voltage source (E, Zi) connected to the cathode (2) of the tube and to a reference potential (0), a first capacitive element (C1) connected to the voltage source for delivering a current to the wave structure (5) during the time interval the tube is conducting, a second capacitive element (C2) connected between the cathode of the tube and the collector (3) for delivering a current to the collector of the tube during the same time interval and an impedance (Z) connected between said capacitive elements (C1, C2) to prevent a current flow between the capacitive elements (C1, C2).

2. Traveling wave tube power supply according to claim 1, characterized of said impedance consists of a resistor.

3. Traveling wave tube power supply according to claim 1, in the case that the traveling wave tube comprises a number of depressed collectors, characterized in that the same number of said second capacitive element (C2) as there are collectors are connected between the cathode (2) of the tube and each of the collectors (31, 32, 33) and that the same number of said impedances (Z) as there are collectors are connected between each of the capacitive elements (C2, C3, C4) and said first capacitive element (C1).

* * * * *